United States Patent
Klocke et al.

(10) Patent No.: US 6,338,981 B1
(45) Date of Patent: Jan. 15, 2002

(54) CENTRIFUGALLY ASSISTED UNDERFILL METHOD

(75) Inventors: James J. Klocke, San Clemente; Alan R. Lewis, Carlsbad, both of CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 09/634,114

(22) Filed: Aug. 8, 2000

Related U.S. Application Data

(60) Provisional application No. 60/149,070, filed on Aug. 16, 1999.

(51) Int. Cl.[7] .................. H01L 21/44; H01L 21/48; H01L 21/50
(52) U.S. Cl. .............. 438/112; 438/124; 438/126; 438/127
(58) Field of Search ................ 438/106, 112, 438/124, 126, 127

(56) References Cited

U.S. PATENT DOCUMENTS

| | | | |
|---|---|---|---|
| 5,120,678 A | * | 6/1992 | Moore et al. |
| 5,646,071 A | | 7/1997 | Lin et al. ............ 437/228 |
| 5,981,312 A | * | 11/1999 | Farquhar et al. |
| 6,033,728 A | | 3/2000 | Kikuchi et al. ........ 427/240 |

FOREIGN PATENT DOCUMENTS

JP    11276968 A    10/1999

* cited by examiner

Primary Examiner—Kevin M. Picardat
Assistant Examiner—D. M. Collins
(74) Attorney, Agent, or Firm—Wood, Herron & Evans, L.L.P.

(57) ABSTRACT

A method of underfilling a space between a semiconductor flip chip and a substrate to encapsulate a plurality of electrical connections with a viscous underfill material. The flip chip is mounted to the substrate with a plurality of electrical connections thereby forming a gap between opposed surfaces of the flip chip and substrate. The viscous underfill material is dispensed adjacent at least one edge of the flip chip. The flip chip and substrate are the rotated to move the underfill material into the gap under the influence of centrifugal force. The underfill material is cured after fully encapsulating the electrical connections.

18 Claims, 2 Drawing Sheets

CENTRIFUGALLY ASSISTED UNDERFILL METHOD

This application is based on and claims the priority of Provisional Application Ser. No. 60/149,070, filed Aug. 16, 1999. Provisional Application Ser. No. 60/149,070 is hereby fully incorporated by reference herein.

FIELD OF THE INVENTION

The present invention relates to apparatus and methods for dispensing underfill material used during the attachment of semiconductor chips directly to printed circuit ("PC") boards for flip chip on board or other substrates to form a chip package.

BACKGROUND OF THE INVENTION

In the manufacture of PC boards it is frequently necessary to apply small amounts of viscous materials, i.e., those with a viscosity greater than fifty centipoise. Such materials include, by way of example and not by limitation, general purpose adhesives, solder paste, solder flux, solder mask, grease, oil, encapsulants, potting compounds, epoxies, die attach pastes, silicones, RTV and cyanoacrylates. Common methods of application have included screening, pin transfer and dispensing from a syringe or valve. Screening requires a template and is not readily adaptable to changing application patterns. Pin transfer is relatively fast but the tooling is expensive and inflexible and can only form dots, not lines of material. Many manufacturers use syringe dispensing with pneumatic mechanisms, electromechanical mechanisms or positive displacement valves.

Flip chip technology has developed as a result of the movement toward ever increasing miniaturization of circuitry. This technology is also known as direct chip attach or "DCA". It includes "flip chip" bonding, dies attached directly to substrates, wire bonding, coated dies and encapsulated dies. One such process which is widely used is known as controlled columnar collapsed connection ("C4").

Generally referring to FIGS. 1–3, a semiconductor die or flip chip 10 is provided with a pattern of solder bumps or balls 12 on an underside or circuit side thereof. The solder balls 12 are registered or aligned with solder pads 14 on a PC board or similar substrate 16. The underside of the chip 10 is also referred to as the image side of the chip. Flux (not shown) is normally supplied between the solder balls 12 and solder pads 14. Upon heating, the solder pads 14 on the PC board or substrate 16 reflow and physically connect with the solder balls 12 on the underside of the chip 10. The solder balls 12 typically have a high melting point and therefore do not reflow. This connection is illustrated diagrammatically in FIG. 2 by deformed solder pad 14' mating with a solder ball 12. This process eliminates the requirement for wire bonding.

Since the flip chip 10 is not necessarily encapsulated in a plastic or ceramic package, the connections between the PC board 16 and the chip 10 can corrode. In order to prevent this corrosion, a special liquid epoxy 18 (FIG. 3) is used to completely fill the underside of the chip. This is referred to herein as the "underfill" operation. Upon curing, the resulting encapsulation forms a non-hygroscopic barrier to prevent moisture from contacting and thus corroding the electrical interconnects between the PC board 16 and the chip 10. The epoxy 18 also serves to protect the bonds between the deformed solder pads 14' and the solder balls 12 by providing thermal stress relief, i.e., accommodating different rates of thermal expansion and contraction. Stated another way, the cured epoxy 18 has a co-efficient of thermal expansion ("CTE") which, together with its bonding properties, minimizes the thermal stress induced by the difference between the CTE of the silicon chip 10 and the CTE of the PC board 16.

Advantages of using flip chips on board architecture include: 1) the potential for increased input and output ("I/O") as the entire die area beneath the chip is available for connection; 2) an increase in electronic processing speed due to shorter transmission line lengths; 3) the ability to fit a heat sink to the top of the chip; 4) a substantial reduction in chip profile; and 5) more efficient use of PC board real estate.

Referring to FIG. 3 of the drawings, once the underfill operation is complete, it is desirable that enough liquid epoxy be deposited along the edges of the chip 10 to fully encapsulate all of the electrical interconnections and so that a fillet 18a is formed along the side edges of the chip 10. Normally, the liquid epoxy flows under the chip 10 as a result of capillary action due to the small gap between the underside of the chip 10 and the upper surface of the PC board or substrate 16. If the chip is relatively large or the gap is unusually small, however, some of the electrical interconnections will not be encapsulated and voids 20 may exist. If such voids are present, then corrosion and undesirable thermal stresses may result.

It would therefore be desirable to provide a manner of underfilling the space between a semiconductor flip chip and a substrate, and especially in applications involving smaller than normal gaps or larger than normal flip chips, while preventing any voids or spaces left unfilled between the flip chip and substrate.

SUMMARY OF THE INVENTION

Generally, the invention relates to a method of underfilling a space between a semiconductor flip chip and a substrate to encapsulate a plurality of electrical connections with a viscous underfill material, such as epoxy resin. The method involves mounting the flip chip to the substrate with a plurality of electrical connections thereby forming a gap between opposed surfaces of the flip chip and substrate. The flip chip and substrate may be previously supplied in this form as an alternative. The viscous underfill material is dispensed adjacent at least one edge of the flip chip. The flip chip and the substrate are then rotated to move the underfill material into the gap under the influence of centrifugal force. This movement can additionally occur under the influence of capillary action or other means as well. In other words, the use of centrifugal force may only assist with the movement of material into the gap. The underfill material is then cured after fully encapsulating the electrical connections. In one manner of carrying out the invention, the substrate and flip chip may be mounted on a rotatable table or support such that the dispensed underfill material is located initially at an innermost edge of the flip chip with respect to the axis of rotation of the table. Centrifugal force will then act on the underfill material as the table rotates to move the material radially outward beneath the flip chip to entirely encapsulate the electrical connections.

As separate alternative aspects, which may or may not be combined, the flip chip and substrate may be heated at least during the rotating step to assist with the flow of underfill material and the flip chip and substrate may be rotated within a vacuum atmosphere to further reduce the occurrence of voids.

As another alternative manner of carrying out the invention, a dam is provided around more than one edge of the flip chip and opens toward the inner edge that receives the underfill material. In one embodiment, the dam may be formed from a gasket material, such as an elastomer, and may be temporary. That is, the dam may be removed after the centrifugal underfilling procedure. In another embodiment, the dam may be formed from curable material, such as an epoxy. This dam is permanent and is cured prior to rotating the flip chip and substrate. In each embodiment, the dam acts to contain the underfill material beneath the flip chip as the flip chip and substrate are rotated to encapsulate the electrical connections. For example, when the flip chip is a four-sided chip, the temporary or permanent dam may be provided adjacent three of the four edges, while the underfill material is dispensed adjacent a fourth edge disposed closest to the axis of rotation. This aspect of the invention is also applicable to other multi-sided flip chips having various shapes.

From the foregoing summary and the detailed description to follow, it will be understood that the invention provides a unique and effective manner of underfilling flip chips. The invention is particularly advantageous in flip chip applications in which very small gaps are formed between the flip chip and the substrate or in applications utilizing relatively large flip chips having a large space to underfill. In these situations, the capillary action normally relied upon to move the underfill material into the gap may not be enough to fully encapsulate the electrical connections and the centrifugal force utilized in the present invention can be used to ensure full encapsulation.

Additional features, advantages and objectives of the invention will become more readily apparent to those of ordinary skill upon review of the following detailed description of the preferred embodiments taken in conjunction with the accompanying drawings.

DETAILED DESCRIPTION OF THE PREFERRED EMBODIMENTS

Figure 1:
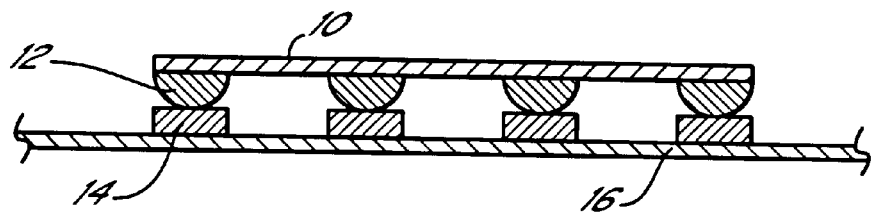
FIG. 1 is a cross sectional view schematically showing a flip chip and substrate prior to a reflow procedure to electrically connect a plurality of solder bumps or balls and solder pads in the prior art.
Figure 2:
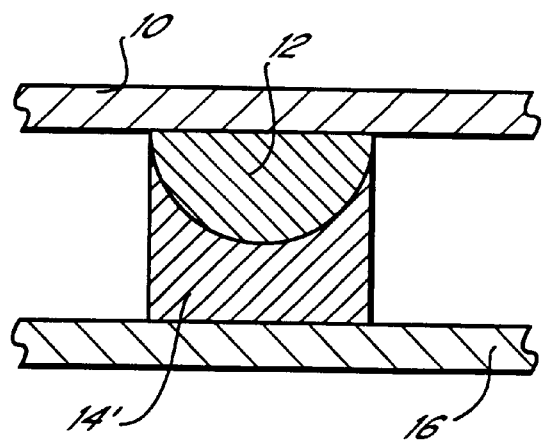
FIG. 2 is an enlarged fragmentary view showing the interconnection of one of the deformed solder pads of FIG. 1 with its corresponding solder ball after reflow in accordance with the prior art.
Figure 3:
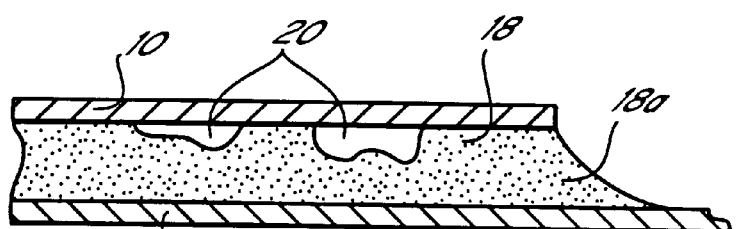
FIG. 3 is an enlarged, fragmentary cross sectional view of the flip chip and substrate of FIG. 1 after an underfilling operation during which voids remain between the flip chip and substrate.
Figure 4:
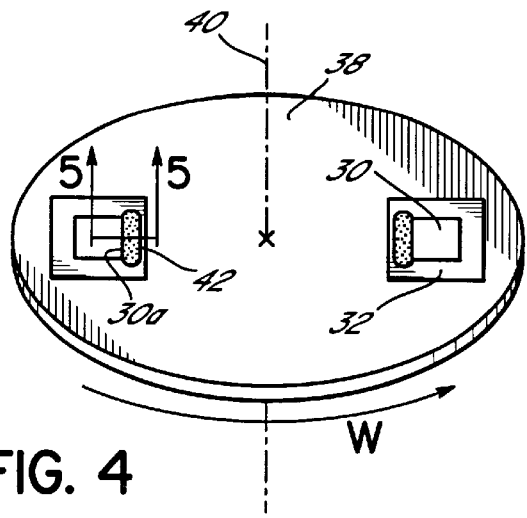
FIG. 4 is a perspective view schematically illustrating a process and apparatus for carrying out the invention.
Figure 5:
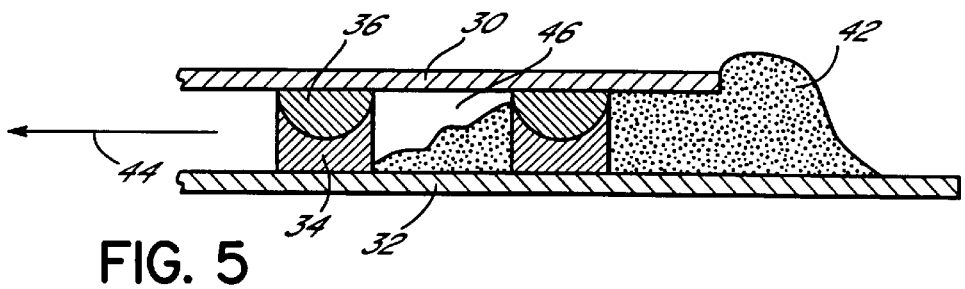
FIG. 5 is a fragmented and enlarged cross sectional view taken generally along line 5—5 of FIG. 4 showing the flip chip, substrate and underfill material under the influence of centrifugal force during the underfill operation.

Referring to FIGS. 4 and 5, a flip chip 30 and substrate 32, such as a PC board, are initially connected together both mechanically and electrically through the previously described reflow operation. During this operation, solder pads 34 melt and flow around solder balls 36. The combined flip chip and substrate assembly 30, 32 is then mounted on a rotatable wheel in a suitable manner (not shown) which temporarily retains them on the wheel 38 during subsequent rotation about wheel axis 40. Before or after mounting on wheel 38, a bead of underfill material, such as conventional epoxy resin, is dispensed along a radially inner edge 30a of flip chip 30. Thus, during subsequent rotation at a speed W centrifugal force generally in the direction of arrow 44 will help direct underfill material 42 into gap 46 between flip chip 30 and substrate 32. After underfill material 42 fully fills gap 46 and encapsulates the electrical connections formed by solder pads and balls 34, 36, material 42 may be cured in a conventional manner. The speed W will depend on the particular application parameters, such as the physical characteristics of the underfill material, the chip size and the gap size.

Additional steps may be taken, as in conventional underfilling operations, to assist with the flow of material 42 within gap 46. Most notably, these include the application of heat to flip chip 30 and substrate 32 throughout any or all steps in the underfilling operation. Heat may be applied to flip chip 30 and/or substrate 32 before, during and/or after dispensing the underfill material. Also, the underfilling operation may be performed in a vacuum atmosphere to further reduce the occurrence of voids within gap 46.

Figure 6:
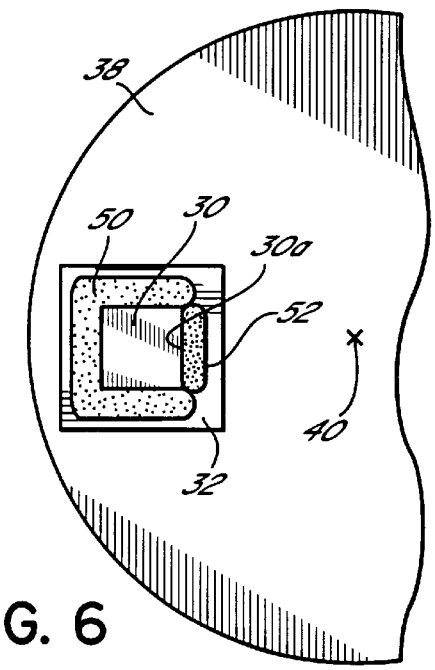
FIG. 6 is a fragmentary top view partially showing a rotatable wheel and a flip chip utilizing a dam of curable material during the underfilling operation.

An alternative embodiment is shown in FIG. 6 and illustrates the use of a dam 50 surrounding three sides of a four-sided flip chip 30. Flip chip 30 and substrate 32 are again shown mounted to rotatable wheel 38 and include a bead of viscous underfill material 52 dispensed adjacent an inner edge 30a of flip chip 30 which is closest the axis of rotation 40. In this alternative, dam 50 may be formed with beads of curable material, such as epoxy resin, or may be formed with removable gasket material, such as a silicone elastomer. In each case, the dam opens toward edge 30a of flip chip 30. Therefore, as table 38 is rotated, underfill material 52 will again be centrifugally forced in a radially outward direction 44 (FIG. 5) but will be prevented from flowing outside of flip chip 30 by dam 50. It will be appreciated that flip chips of other shapes and having other multi-sided configurations will also benefit from this general aspect of the invention.

While the present invention has been illustrated by a description of a preferred embodiment and while this embodiment has been described in some detail, it is not the intention of the Applicants to restrict or in any way limit the scope of the appended claims to such detail. Additional advantages and modifications will readily appear to those skilled in the art. This has been a description of the present invention, along with the preferred methods of practicing the present invention as currently known.

However, the invention itself should only be defined by the appended claims, wherein we claim:

1. A method of underfilling a gap disposed between a semiconductor chip and a substrate to encapsulate a plurality of electrical connections between the chip and the substrate, the method comprising:

dispensing a viscous underfill material adjacent at least a first edge of the chip, rotating the chip and the substrate to move the underfill material into said gap, and curing the underfill material after fully encapsulating the electrical connections with said underfill material.

2. The method of claim 1, wherein the chip includes at least four edges and the method further comprises:

prior to said rotating step, providing a dam of sealing material adjacent at least three of the four edges and opening toward said first edge.

3. The method of claim 2, wherein the step of providing a dam further comprises:

sealing the three edges with a temporary gasket material.

4. The method of claim 1, wherein the chip includes at least four edges and the method further comprises:

dispensing a curable material adjacent at least three of the four edges to form a dam opening toward said one edge, and curing the dam prior to the rotating step.

5. The method of claim 1 further comprising:

heating the chip and the substrate at least during the rotating step.

6. The method of claim 1, wherein the step of rotating the chip and substrate further comprises:

rotating the chip and substrate within a vacuum atmosphere.

7. A method of underfilling a gap disposed between a semiconductor chip and a substrate to encapsulate a plurality of electrical connections between the chip and the substrate, the method comprising:

heating the chip and substrate, dispensing a viscous underfill material adjacent at least one edge of the chip, rotating the chip and the substrate within a vacuum atmosphere to move the underfill material into said gap, and curing the underfill material after fully encapsulating the electrical connections with said underfill material.

8. The method of claim 7, wherein the chip includes at least four edges and the method further comprises:

dispensing a curable material adjacent at least three of the four edges to form a dam opening toward said one edge, and curing the dam prior to the rotating step.

9. The method of claim 7, wherein the chip includes at least four edges and the method further comprises:

prior to said rotating step, providing a dam of sealing material adjacent at least three of the four edges and opening toward said one edge.

10. The method of claim 9, wherein the step of providing a dam further comprises:

sealing the three edges with a temporary gasket material.

11. A method of underfilling a gap between a multi-sided semiconductor chip and a substrate to encapsulate a plurality of electrical connections between the chip and the substrate, the method comprising:

forming a dam adjacent a first plurality of edges of the chip which opens toward at least one additional edge, dispensing a viscous underfill material adjacent at least said additional edge, rotating the chip and the substrate to move the underfill material into said gap under the influence of centrifugal force, and curing the underfill material after fully encapsulating the electrical connections with said underfill material.

12. The method of claim 11 further comprising:

heating the chip and the substrate at least during the rotating step.

13. The method of claim 12, wherein the step of rotating the chip and substrate further comprises:

rotating the chip and substrate within a vacuum atmosphere.

14. The method of claim 11, wherein the step of rotating the chip and substrate further comprises:

rotating the chip and substrate within a vacuum atmosphere.

15. The method of claim 11, wherein the step of forming a dam further comprises:

sealing the first plurality of edges with a temporary gasket material.

16. The method of claim 11, wherein the step of forming a dam further comprises:

dispensing a curable sealing material adjacent the first plurality of edges.

17. The method of claim 1, wherein the chip includes a plurality of edges or sides and the method further comprises:

prior to said rotating step, sealing all of the edges or sides except for the first edge.

18. The method of claim 7, where the chip includes a plurality of edges or sides and the method further comprises:

prior to said rotating step, sealing all of the edges or sides except for the first edge.

* * * * *